United States Patent
Dillon et al.

(10) Patent No.: US 7,231,625 B2
(45) Date of Patent: Jun. 12, 2007

(54) METHOD AND APPARATUS FOR USE OF HIDDEN DECOUPLING CAPACITORS IN AN INTEGRATED CIRCUIT DESIGN

(75) Inventors: Michael N. Dillon, Richfield, MN (US); Christopher J. Tremel, St. Louis Park, MN (US)

(73) Assignee: LSI Corporation, Milpitas, CA (US)

( * ) Notice: Subject to any disclaimer, the term of this patent is extended or adjusted under 35 U.S.C. 154(b) by 394 days.

(21) Appl. No.: 10/952,194

(22) Filed: Sep. 28, 2004

(65) Prior Publication Data

US 2006/0075369 A1 Apr. 6, 2006

(51) Int. Cl.
*G06F 17/50* (2006.01)

(52) U.S. Cl. ............ 716/13; 716/8; 716/9; 716/10

(58) Field of Classification Search ............ 716/13, 716/8, 9, 10
See application file for complete search history.

(56) References Cited

U.S. PATENT DOCUMENTS

| | | | |
|---|---|---|---|
| 5,668,399 A | 9/1997 | Cronin et al. | 257/532 |
| 5,726,485 A | 3/1998 | Grass | 257/532 |
| 5,739,576 A | 4/1998 | Shirley et al. | 257/532 |
| 5,959,320 A | 9/1999 | Torgerson et al. | 257/296 |
| 6,310,815 B1* | 10/2001 | Yamagata et al. | 365/230.03 |
| 6,563,192 B1 | 5/2003 | Corisis et al. | 257/532 |
| 7,062,732 B2* | 6/2006 | Ito et al. | 716/5 |
| 2004/0228066 A1* | 11/2004 | Sakurabayashi et al. | 361/302 |
| 2005/0229132 A1* | 10/2005 | Butt et al. | 716/10 |

* cited by examiner

*Primary Examiner*—Sun James Lin
(74) *Attorney, Agent, or Firm*—Westman, Champlin & Kelly

(57) ABSTRACT

A method and apparatus are provided for placing cells in an integrated circuit layout pattern. A base layer layout pattern defines an array of base cell locations and base layer elements, wherein at least portions of some rows in the array are reserved for decoupling capacitor cells. Each decoupling capacitor cell has a width, which is greater than that of a single base cell location and which is abstracted from the base layer layout pattern. A cell library defines a plurality of cells, including a macro cell having open rows consistent with the rows in the base layer layout pattern that are reserved for the decoupling capacitor cells. The width of each decoupling capacitor cell is abstracted from the macro cell. Cells from the cell library, including the macro cell, are placed within a design layout pattern relative to the base layer layout pattern. An area consumed by the macro cell within the design layout pattern is independent of the width of the decoupling capacitor cells.

16 Claims, 7 Drawing Sheets

METHOD AND APPARATUS FOR USE OF HIDDEN DECOUPLING CAPACITORS IN AN INTEGRATED CIRCUIT DESIGN

FIELD OF THE INVENTION

The present invention relates to the development of semiconductor integrated circuit layout definitions and more particularly to a method and apparatus for using hidden decoupling capacitor cells in gate array type designs, for example.

BACKGROUND OF THE INVENTION

Semiconductor integrated circuits are designed and fabricated by first preparing a schematic diagram or hardware description language (HDL) specification of a logical circuit in which functional elements are interconnected to perform a particular logical function. The schematic diagram or HDL specification is then synthesized into cells of a specific cell library. Each cell corresponds to a logical function unit, which is implemented by one or more transistors that are optimized for the cell. A series of computer-added design tools generate a netlist of the selected cells and the interconnections between the cells. The netlist is used by floor planner or placement tool to place instances of the selected cells at particular locations in a layout pattern. A routing tool routes the interconnections between the cells along predetermined routing layers. Once the selected cells have been placed and routed, the netlist, the cell layout definitions, the placement data and the routing data together form an integrated circuit layout definition, which is used to fabricate the integrated circuit.

An integrated circuit is fabricated by depositing layers on a substrate known as a wafer. The lowest, "base" layers include the active areas of the transistors, including the diffusion regions and the gate oxide areas, and the desired patterns of the polysilicon gate electrodes. The base layers also include other base elements, such as power and ground voltage supply rails. One or more metal layers are deposited on top of the base layers and patterned to form conductive segments, which interconnect the various elements in the base layers. Electrical contacts or vias may be formed to electrically connect a conductive segment on one of the metal layers with a conductive segment on another metal layer or an element on a base layer.

A gate array type integrated circuit has a predefined base layer layout pattern in which arrays of functionally uncommitted transistors, logic gates and other active devices and features are placed at predefined locations. The base layers can be fabricated on a substrate according to the base layer layout pattern before the overall function of the circuit has been defined. These base layers are provided by the semiconductor manufacturer and are non-programmable or configurable by the design customer.

The design customer receives a cell library and the base layer layout pattern (know as a master slice) from the semiconductor manufacturer and creates a design layout pattern for selectively "metalizing" higher metal layers that interconnect the base layer elements to implement a specified function. Once the design layout pattern is complete, the higher metal layers can be fabricated on top of the base layers to complete the integrated circuit.

One of the additional elements that is often fabricated within the base layers is an array of power supply decoupling capacitors. As the switching speeds of integrated circuits continue to increase, decoupling capacitors are being embedded in integrated circuit designs in order to stabilize the bias voltage levels throughout the integrated circuit. In gate arrays, decoupling capacitors have been placed at regular intervals in the base layer layout pattern. These decoupling capacitors can be formed as parallel plate capacitors, with one plate being formed by the diffusion region of one or more base cell locations and the other plate being formed by polysilicon, which overlaps the diffusion region. The diffusion region is electrically coupled to one power supply rail and the polysilicon layer is coupled to the other power supply rail.

Although decoupling capacitors improve the stability of voltage supply levels on an integrated circuit, design rules that govern the placement and layout of the various elements of the integrated circuit can create inefficiencies when dealing with the decoupling capacitors. For example if each decoupling capacitor instance occupies a small number of base cell locations, edge set back requirements of the base cell locations may limit the capacitance per unit area of each decoupling capacitor. However if each decoupling capacitor instance occupies a large number of base cell locations, backend placement tools may require the boundaries of macro cells that overlap one or more capacitor cells to "snap" or enlarge to the next nearest capacitor cell boundary. This increases the area consumed by the macro cell.

Another problem with the use of decoupling capacitors is the extra processing resources and database space required by the backend tools to manage the details associated with the decoupling capacitors. The existence of decoupling capacitors increases the amount of data that must be handled by backend tools. Cell placement and routing tools must take into account the presence and boundaries of the decoupling capacitor cells when placing logic gates within the layout pattern and when routing their interconnections. This increases the resource requirements in order to layout an integrated circuit design.

Improved methods and apparatus are desired for handling decoupling capacitors in integrated circuit layout designs.

SUMMARY OF THE INVENTION

One embodiment of the present invention is directed to a method of placing cells in an integrated circuit layout pattern. A base layer layout pattern is received, which defines an array of base cell locations and base layer elements, wherein at least portions of some rows in the array are reserved for decoupling capacitor cells. Each decoupling capacitor cell has a width, which is greater than that of a single base cell location and which is abstracted from the base layer layout pattern. A cell library is received, which defines a plurality of cells, including a macro cell having open rows consistent with the rows in the base layer layout pattern that are reserved for the decoupling capacitor cells. The width of each decoupling capacitor cell is abstracted from the macro cell. Cells from the cell library, including the macro cell, are placed within a design layout pattern relative to the base layer layout pattern. An area consumed by the macro cell within the design layout pattern is independent of the width of the decoupling capacitor cells.

Another embodiment of the present invention is directed to a method of generating an integrated circuit layout pattern. The method includes generating a base layer layout pattern defining an array of base cell locations and base layer elements, wherein at least portions of some rows in the array comprise decoupling capacitor cells. Each decoupling capacitor cell has a width, which is greater than that of a single base cell location. The decoupling capacitor cells are abstracted from the base layer layout pattern to form a customer slice layout pattern. A cell library is generated, which defines a plurality of cells, including a macro cell having open rows consistent with the rows in the base layer layout pattern that comprise the decoupling capacitor cells. However, the width of each decoupling capacitor cell is abstracted from the macro cell such that the macro cell consumes an area that is independent of the width of each decoupling capacitor cell. The customer slice layout pattern and the cell library are provided to a design customer for generating a customer design layout pattern of configurable layers in the integrated circuit layout pattern that are higher than base layers defined by the base layer layout pattern.

Another embodiment of the present invention is directed to a customer design layout pattern for fabrication of higher level configurable layers on a gate array having predefined, non-configurable base layers. The layout pattern includes a pattern of cell instances selected from a cell library and placed in available base cell locations defined by the non-configurable base layers. The layout pattern further includes a macro cell selected from the cell library and placed in a block of the available base cell locations. The macro cell has an open row, which overlaps a row of the non-configurable base layers that includes one or more decoupling capacitor cells. The width of each decoupling capacitor cell along the open row is abstracted from the layout pattern, and the macro cell consumes an area on the layout pattern that is independent of the width of each decoupling capacitor cell.

DETAILED DESCRIPTION OF ILLUSTRATIVE EMBODIMENTS

Figure 1:
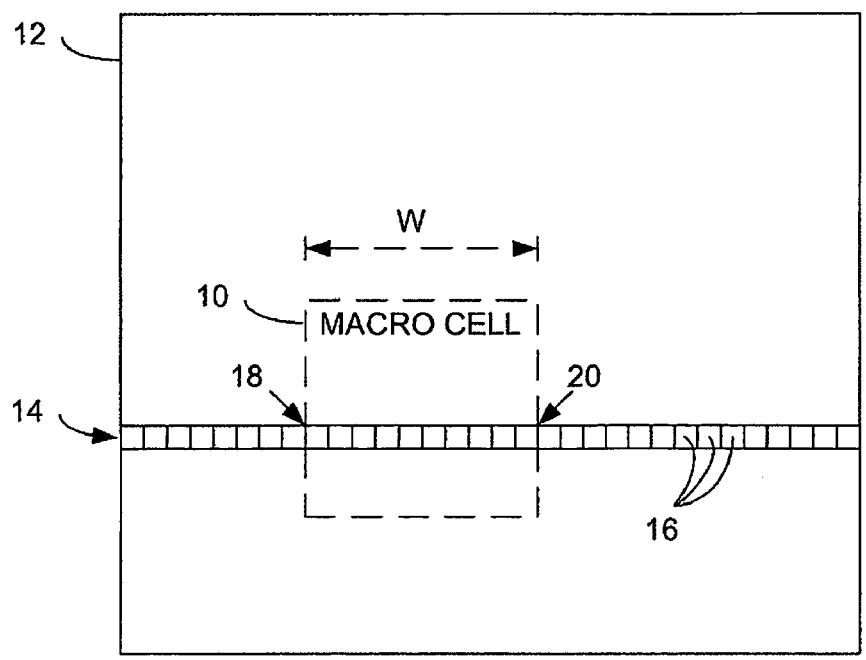
FIG. 1 is a diagram illustrating placement of a macro cell relative to a base layer layout pattern for a gate array type integrated circuit according to the prior art.

FIG. 1 is a diagram illustrating placement of a macro cell 10 relative to a base layer layout pattern 12 for a gate array type integrated circuit according to the prior art. A base layer layout pattern for a gate array defines an array of base cell locations and pre-defined, non-configurable base layer elements that are fabricated in the base layers of the integrated circuit wafer. The base layer elements can include arrays of functionally uncommitted active devices, power and ground voltage supply rails, and other devices such as decoupling capacitor cells.

Decoupling capacitor cells can be fabricated in base cell locations for stabilizing the voltage levels on the power supply rails. Decoupling capacitor cells can be formed as parallel plate capacitors, with one plate being formed by the diffusion region in the base cell location and the other plate being formed by a polysilicon plate, which overlaps the diffusion region. A dielectric layer is positioned between the polysilicon plate and the diffusion region. The diffusion region is electrically coupled to one power supply rail, and the polysilicon plate is coupled to the other power supply rail.

One such row of decoupling capacitor cells is shown in FIG. 1 at row 14. Row 14 includes a plurality of decoupling capacitor cells 16. When a design customer creates a design layout pattern for interconnecting the active devices defined by the base layer layout pattern, the customer selects cells from a cell library and places instances of those cells in the design layout pattern relative to the base layer layout pattern. These cells can include relatively small cells, such as AND, OR, NAND and NOR gates, or larger macro cells which implement more complex functions. The details of the base layer elements, including those of decoupling capacitor cells 16 are visible to the backend tools used by the design customer to place and route cells within the design layout pattern.

Macro cells, such as macro cell 10 in FIG. 1, typically consume a large number of base cell locations. When a macro cell is placed within a layout pattern, the macro cell will typically overlap one or more rows 14 of decoupling capacitor cells 16. The backend tools typically require that each cell be placed such that its boundaries align with the boundaries of the base cell locations and with the boundaries of any base cell elements within the cell.

In the placement shown in FIG. 1, macro cell 10 overlaps several decoupling capacitor cells 16 along row 14. The cell placement tool will therefore "snap" or enlarge the width "W" of macro cell 10 such that the boundaries of the macro cell align with the nearest boundaries of decoupling capacitor cells 16, as shown at 18 and 20.

If each capacitor cell 16 has a "coarse" grain such that it consumes multiple base cell locations, the placement rules that require macro cell 10 to align with the boundaries of capacitor cells 16 may require the size of macro cell 10 to be enlarged by a relatively large increment. This results in wasted area within the integrated circuit since the macro cell boundaries are enlarged beyond the area required by its internal components. Thus, a "fine" grain decoupling capacitance layout would typically need to be used for all capacitors in order to allow each macro cell boundary to have a reasonable x-dimension width and placement granularity.

If capacitor cells 16 have a fine grain such that each cell 16 consumes a small number of base cell locations, such as one or two locations, the width "W" of macro cell 10 can "snap" to the next nearest capacitor cell boundary with a much finer resolution. This limits the area consumed by macro cell 10. However, as described with reference to FIG. 2, such fine grain capacitor cells have less capacitance per unit area than coarse grain capacitor cells.

Another difficulty with the placement process shown in FIG. 1 is that the cell placement and routing tools must account for the details of all cells in the layout pattern, including the decoupling capacitor cells 16. This significantly increases the size of the databases being handled by the design tools and increases the run times associated with each tool.

Figure 2:
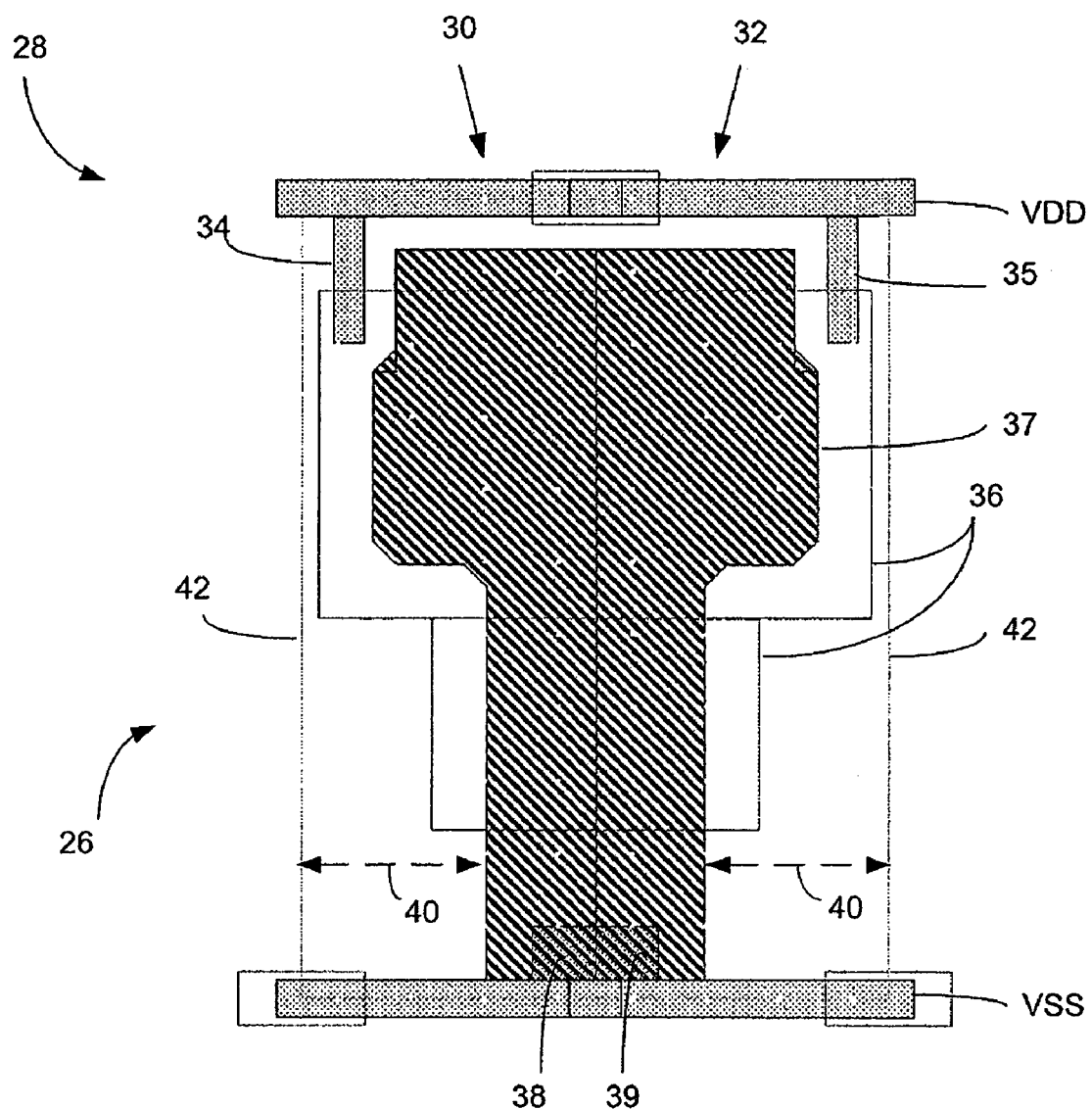
FIG. 2 is a diagram illustrating a single "fine" grain decoupling capacitor cell.

FIG. 2 is a diagram illustrating a single "fine" grain decoupling capacitor cell 26 defined within two adjacent base cell locations 30 and 32 of a base layer layout pattern 28. Layout pattern 28 includes power supply rail VDD, ground supply rail VSS, voltage straps 34 and 35, diffusion region 36 and polysilicon "plate" 37. Voltage straps 34 and 35 electrically couple diffusion region 36 to voltage supply rail VDD. Vias 38 and 39 electrically couple polysilicon plate 37 with ground supply rail VSS. The overlap between polysilicon plate 37 and diffusion region 36 forms the effective area of the capacitor cell.

Typical design rules require elements in each cell to have set backs 40 from the edges or boundaries 42 of the cell. This limits the area of the polysilicon layer and therefore the capacitance per unit area of the "fine" grain capacitor cell defined in base cell locations 30 and 32.

Figure 3:
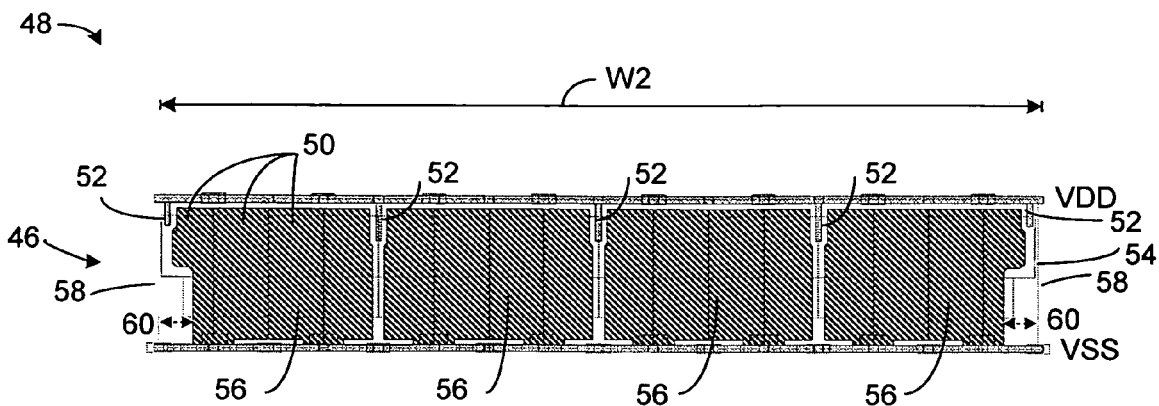
FIG. 3 is a diagram illustrating a single "coarse" grain decoupling capacitor cell.

FIG. 3 is a diagram illustrating a single "coarse" grain decoupling capacitor cell 46 defined within a larger number of base cell locations 50 of a base layer layout pattern 48. In this example, capacitor cell 46 consumes 16 base cell locations and has a width W2. Layout pattern 48 includes voltage supply rails VDD and VSS, voltage straps 52, diffusion region 54, polysilicon plates 56 and x-dimension boundaries 58.

As shown in FIG. 3, the design rules apply edge setbacks 60 only to the outer two of the 16 base cell locations consumed by capacitance cell 46. This provides a greater capacitance per unit area within the base layer layout pattern for each decoupling capacitor cell 46. However, as described above, the use of such a coarse grain capacitance layout in a typical design system would require macro cells to expand their widths to the next widest boundaries of the capacitance cells.

Figure 4:
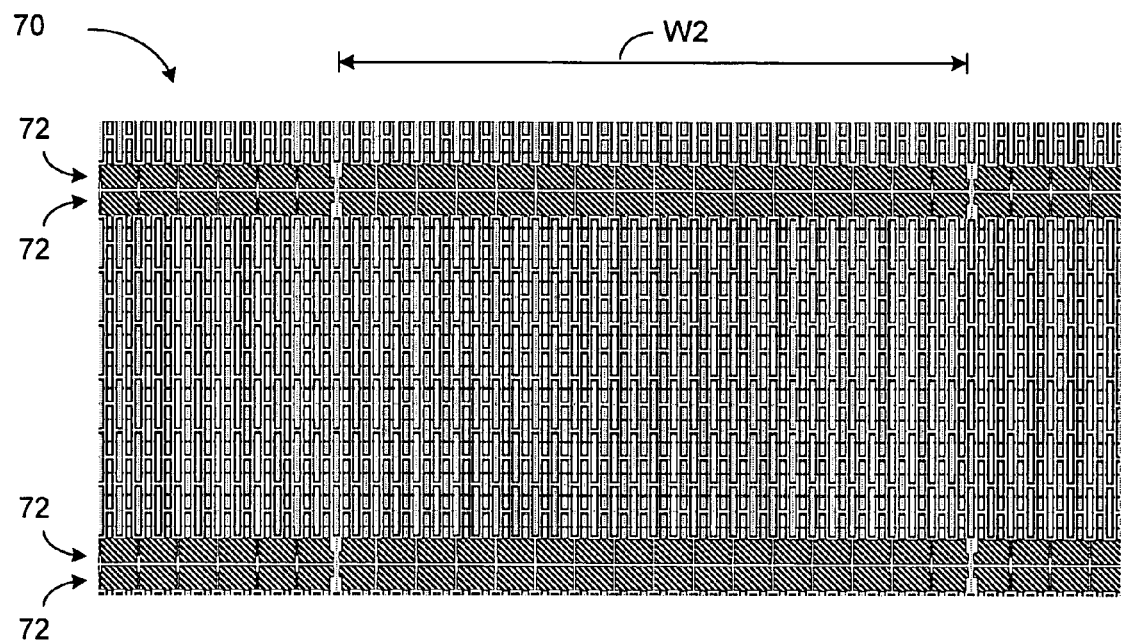
FIG. 4 is a diagram illustrating a base layer layout pattern having rows of "coarse" grain decoupling capacitor cells visible within the pattern.

FIG. 4 is a diagram illustrating a portion of a base layout pattern 70 having rows of "coarse" grain decoupling capacitor cells, similar to the capacitor cell shown in FIG. 3, which are visible within the pattern. Base layer layout pattern 70 includes a plurality of rows 72 containing decoupling capacitor cells. Each decoupling capacitor cell has a coarse grain layout having a width W2, which spans 16 base cell locations. If a macro cell were placed relative to base layer layout pattern 70 such that it overlaps one or more of the decoupling capacitance rows 72, the design rules would require the macro cell to have boundaries that align with the boundaries of the capacitance cells that are overlapped. The Macro cell would therefore have the following dimensions:

$W_{MACRO} = N*\text{capwidth}, W2$ $H_{MACRO} = M*\text{base cell height}$ where N and M are positive integer variables. Thus, the width of the macro cell would have a coarse granularity in increments of the capacitor cell width.

According to one embodiment of the present invention, the details of the decoupling capacitor cells, including their widths, are abstracted from the base layer layout pattern before the pattern is provided to the backend tools. Since the decoupling capacitor cells are not visible to the backend tools used to place and route the cells used by the design customer, the boundaries of these cells do not have to "snap" to the nearest boundaries of any overlapped decoupling capacitor cell.

Figure 5:
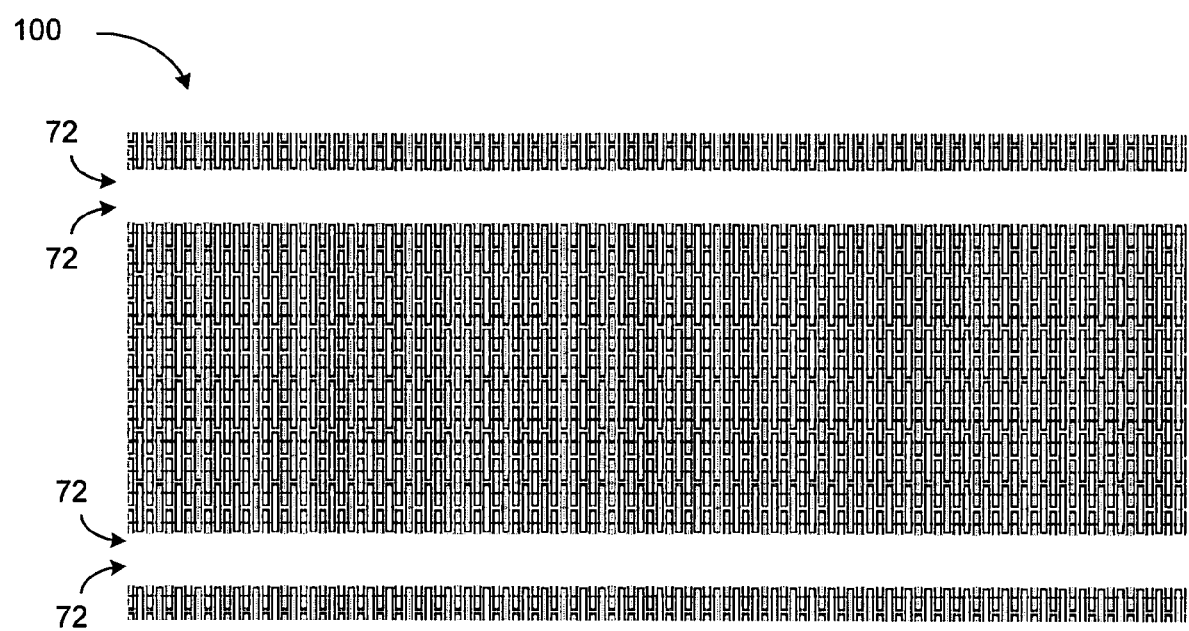
FIG. 5 is a diagram illustrating a base layer layout pattern having rows of "coarse" grain decoupling capacitor cells abstracted from the pattern.

FIG. 5 is a diagram illustrating a portion of a customer slice layout pattern 100, which is similar to the base layer layout pattern 70 shown in FIG. 4, but has the individual decoupling capacitor cells within rows 72 abstracted from the pattern. The widths of each capacitor cell are therefore not visible to the placement tool used by the customer. Rows 72 are simply viewed by the placement tool as blocked areas. Thus when the placement tool places a macro cell within an area on pattern 100 that overlaps portions of one or more of the rows 72, the width of the macro cell is not constrained by the boundaries or widths of the decoupling capacitor cells. The macro cell can therefore have the following dimensions:

$W_{MACRO} = N*\text{base cell width}$ $H_{MACRO} = M*\text{base cell height}$ where N and M are positive integer variables. Thus, the width of the macro cell has a fine granularity in increments of the base cell width.

In the example shown in FIG. 5, layout pattern 100 has two decoupling capacitance rows 72 for every 12 rows of base cell locations. However, rows of decoupling capacitor cells can be placed at various other intervals within the base layer layout pattern and can occupy a full row or only a partial row within the layout pattern.

Figure 6:
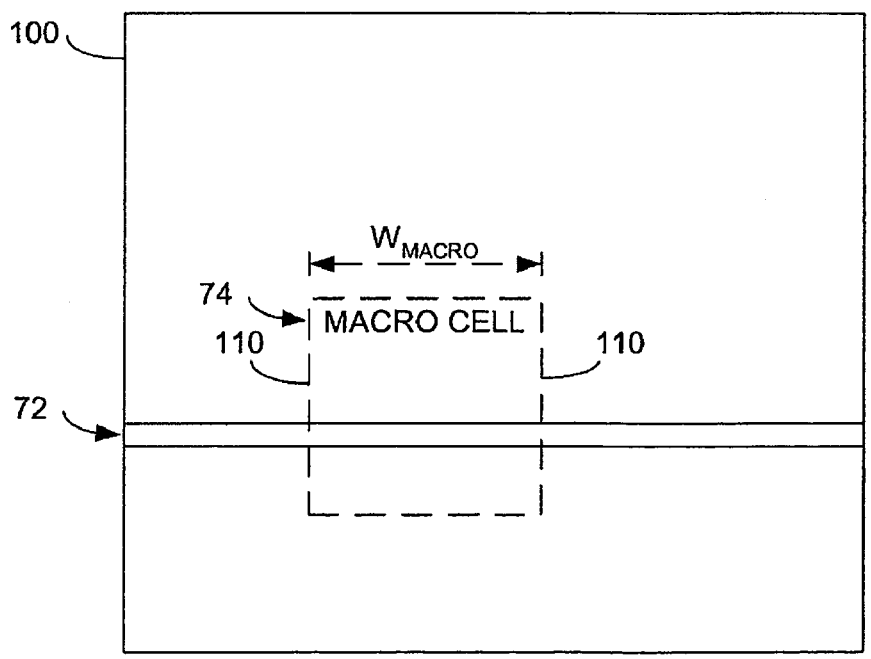
FIG. 6 is a simplified diagram illustrating a macro cell placed within a customer design layout pattern.

FIG. 6 is a simplified diagram illustrating a macro cell 74 placed within a customer design layout pattern relative to the base layer layout pattern 100 shown in FIG. 5 such that the macro cell 74 overlaps a portion of decoupling capacitor row 72. Since the boundaries of the individual decoupling capacitor cells are hidden, the cell placement tool used by the customer does not require the boundaries 110 of macro cell 74 to align with the boundaries of the decoupling capacitor cells. This allows the dimensions of macro cell 74 to be sized with a finer granularity, thereby reducing the area consumed by the macro cell. In one embodiment, the boundaries 110 align with the boundaries of the boundaries nearest base cell locations while ignoring the boundaries of the decoupling capacitor cells. In an alternative embodiment, the cell placement tool does not require the boundaries 110 of macro cell 74 to align with the boundaries of the base cell locations.

Thus, by abstracting the decoupling capacitor cells from the customer slice layout pattern, the granularity of the decoupling capacitor cells can be increased significantly without negatively increasing the placement granularity of the macro cells. This allows each decoupling capacitor cell to provide a greater capacitance per unit area than would be provided if fine grain capacitor cells were used. Further, the details of the decoupling capacitor cells do not contribute to the sizes of the databases used by the backend placement and routing tools and do not slow their performance.

Figure 7:
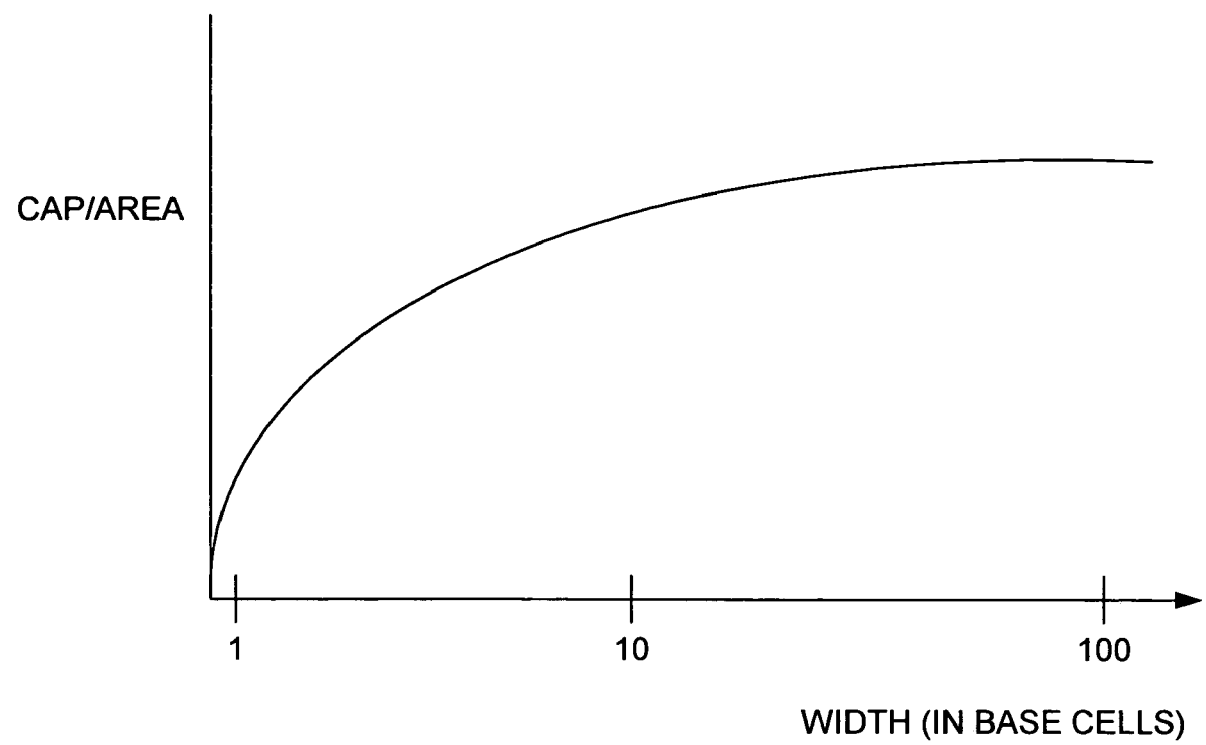
FIG. 7 is a graph illustrating capacitance per unit area as a function of the width of each decoupling capacitor cell.

FIG. 7 is a graph illustrating capacitance per unit area as a function of the width of each decoupling capacitor cell. The width is shown in units of base cell locations that are consumed by the capacitor cell. As the width of each capacitor increases, the capacitance per unit area increases. This is primarily due to the efficiency gained by spreading the edge setback requirements (shown in FIG. 2) over a larger of number of base cell locations. In one embodiment, each decoupling capacitor cell has a width that is at least ten times the width of a single base cell location. In another embodiment, the width of each decoupling capacitor cell is at least 100 times the width of a single base cell location.

Figure 8:
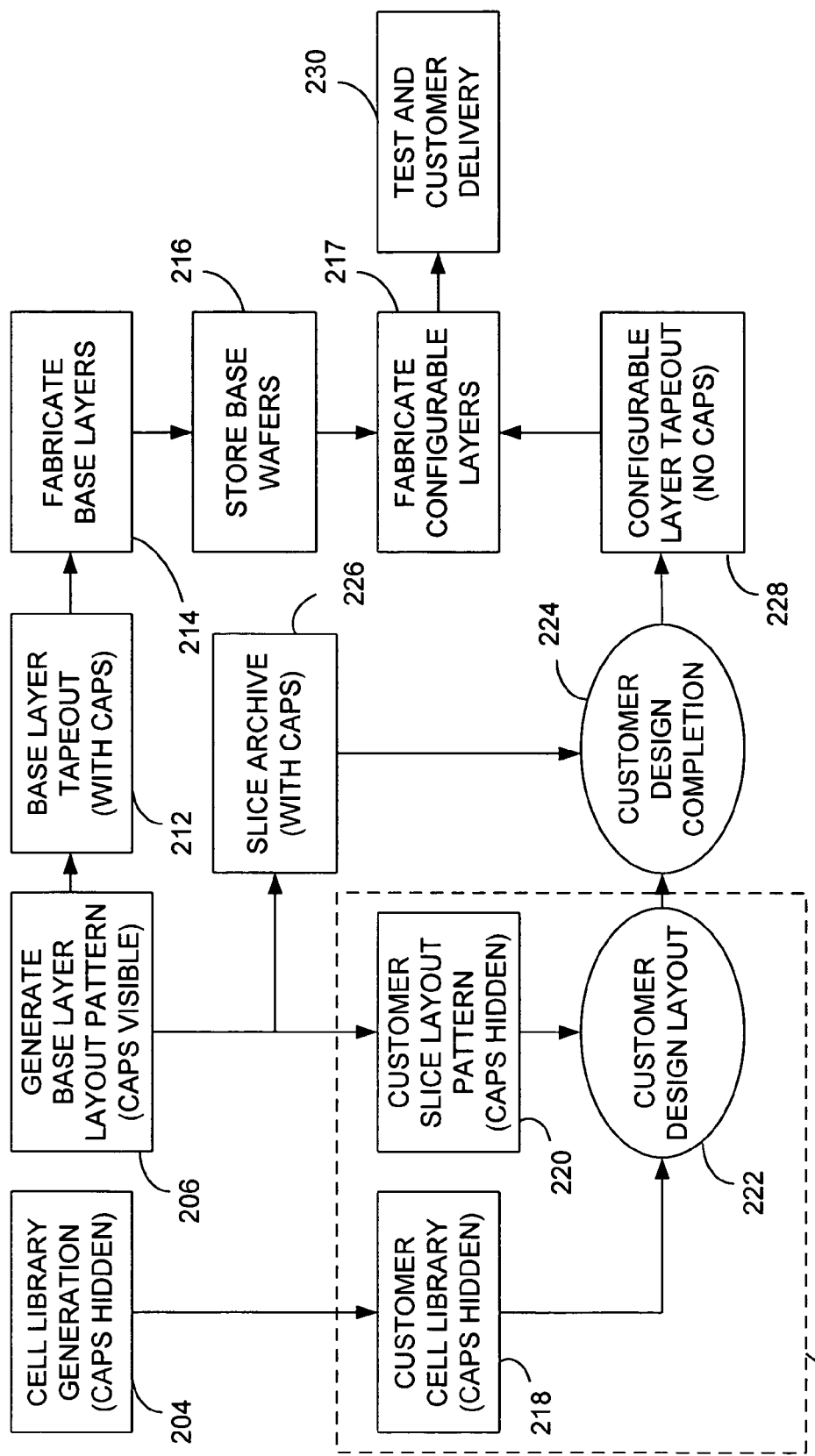
FIG. 8 is a flow chart illustrating an integrated circuit design process according to one embodiment of the present invention.

FIG. 8 is an example of a design process 200 according to one embodiment of the present invention. Dashed boxed 202 represents steps typically performed by a design customer, and the area outside the box represent steps typically performed by the semiconductor manufacturer for the design of a gate array type integrated circuit.

The semiconductor manufacturer generates a cell library, at step 204 and a base layer layout pattern at step 206. The cell library defines a plurality of cells, including any macro cells. The cells in the cell library are each defined by a cell library definition. Each cell library definition includes a cell layout definition and cell characteristics. The layout definition includes information such as a layout pattern of the transistors in the cell and cell routing data. The cell characteristics include cell propagation delays and a model of the cell's function.

In one embodiment, each macro cell in cell library 204 has a macro cell layout pattern having open rows that are consistent with the rows in the base layer layout pattern that contain the decoupling capacitor cells. For example, if the base layer layout pattern generated in step 206 has two rows of decoupling capacitance cells for every 12 rows of base cells, the macro cell layout pattern would have two open rows for every twelve rows in the pattern.

Figure 9:
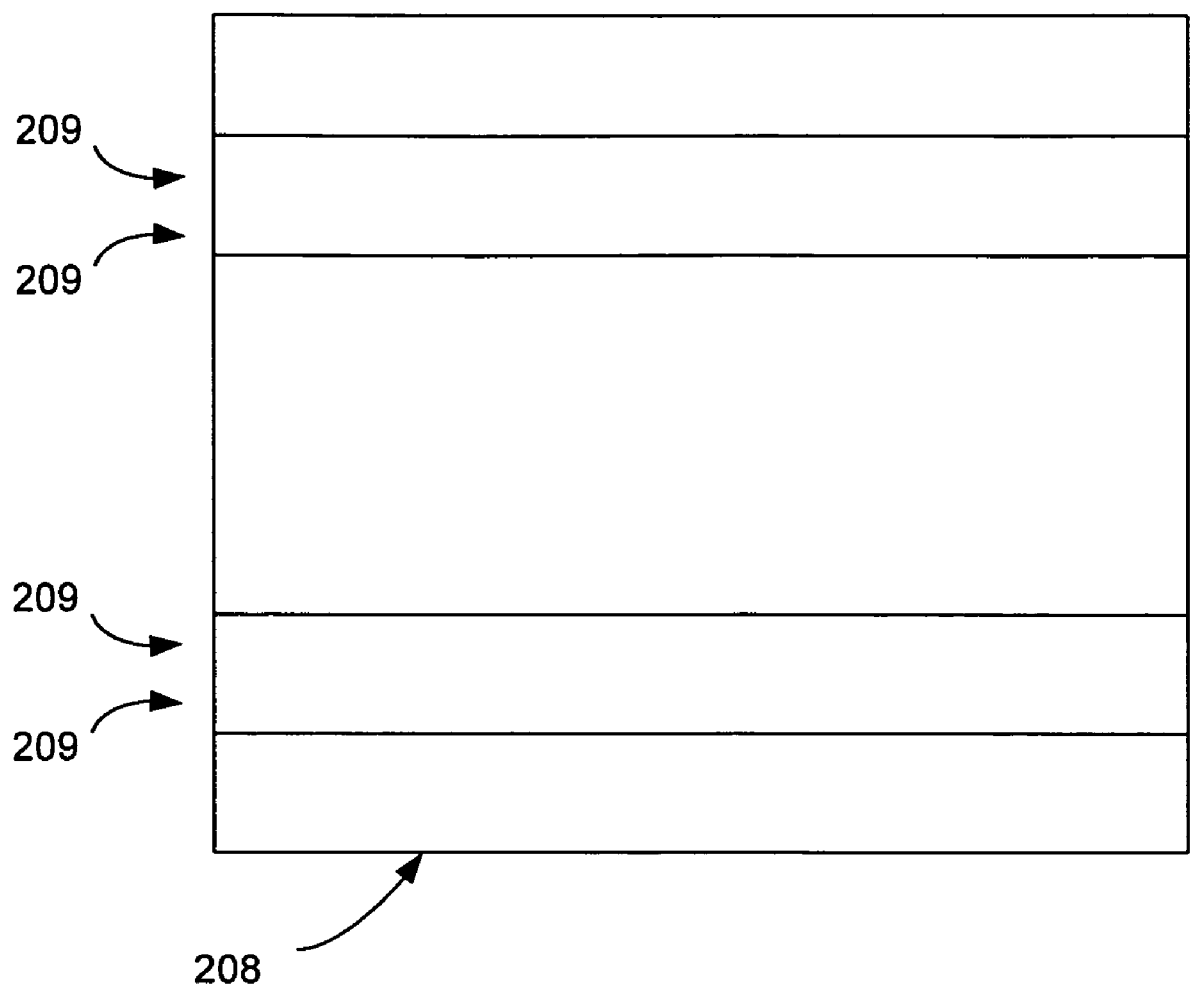
FIG. 9 is a diagram illustrating a macro cell layout pattern having open rows, according to one embodiment of the present invention.

However, the existence of the decoupling capacitor cells is hidden within the macro cell layout pattern, as shown in simplified FIG. 9. Macro cell layout pattern 208 has open rows 209, which correspond within the row spacing of the decoupling capacitor cells in the base layer layout pattern, such as rows 72, shown in FIG. 4. Open rows 209 allow the macro cell to be placed relative to the base layer layout pattern such that no active devices within the macro cell layout pattern occupy the same base cell locations as the decoupling capacitor cells. Since the width of each decoupling capacitor cell is abstracted from the macro cell layout pattern, the macro cell can consume an area that is independent of the width of each capacitor cell.

Referring back to FIG. 8, the base layer layout pattern 206 generated in step 206 defines an array of base cell locations, such as that shown in FIG. 4, and all base layer elements. As described above, these elements can include active devices, decoupling capacitor cells, power and ground supply rails and any other base layer elements. The details of the decoupling capacitor cells, including the boundaries and width of each cell are visible within the base layer layout pattern.

Once the base layer layout pattern has been generated, the pattern can be released to "tape out" in which the photolithography masks used to pattern each of the base layers can be created at 212. The base layers can then be fabricated on a wafer at 214 to form a master slice. The master slices (base wafers) can then be stored, at 216.

A functioning integrated circuit is created by fabricating additional layers on top of the base layers of the master slice, at 217. These higher level layers typically include one or more metal layers containing conductive segments that interconnect the active devices on the base layers in a pattern that is designed to perform a function specified by the customer.

The higher level layers can be designed by the customer within customer space 202. The semiconductor manufacturer delivers to the customer a database containing a customer cell library 218 and a customer slice layout pattern 220. Again, the widths of the decoupling capacitor cells are abstracted from each macro cell layout pattern within customer cell library 218. The decoupling capacitor cells are also abstracted from the base layer layout pattern generated at 206 to form the customer slice layout pattern at 220. The customer slice layout pattern 220 includes a variety of information such as available base locations, the layout of diffusion regions, identification of any blocked base cell locations, the layout of the power mesh, and input-output locations.

At step 222, the customer creates a design layout pattern by selecting cells from customer cell library 218 and placing instances of the cells in a customer design layout pattern, which is consistent with base layers defined by the customer slice layout pattern 220. Interconnections between the cell instances can then be routed to complete the design layout.

Once the customer has completed the design layout pattern, the customer delivers the design to the semiconductor manufacturer, which completes the design at 224. The semiconductor manufacturer overlays the customer design layout pattern with a slice archive 226 to generate the mask patterns for fabricating the higher level layers of the integrated circuit. The customer design layout pattern for the configurable layers can be released to "tape out" in which the masks for the configurable layers can be created at 228. The configurable layers can then be fabricated on top of the base layers of the master slice at 217. The resulting integrated circuits are tested and delivered to the customer, at 230.

As described above, the decoupling capacitors can be fabricated entirely within the base layer elements. In an alternative embodiment, one or more of the decoupling capacitors or at least some of the elements of the capacitors can be fabricated within the higher level, configurable layers. For example, the decoupling capacitors can be formed by patterning overlapping segments on adjacent metal layers and coupling the segments to the power and ground supply rails.

If one or more elements of the decoupling capacitors is formed within one or more of the programmable, configurable layers, an extra step can be used to block these areas from use by the backend tools. Also, additional design verification may be needed to ensure the customer design layout pattern is compatible with the slice or base layer array since the capacitor cells are hidden from the back end tools. Additional checks may also need to be performed to make sure no instances of active cells get placed inadvertently within the capacitor areas.

The above embodiments allow capacitor cells to be designed with a higher capacitance per unit area, thereby reducing the amount of active area that needs to be taken up with capacitor cells. The embodiments also reduce the resource requirements of the backend tools in the design process since these tools do not have to use memory and CPU cycles to track and store the details of the capacitor cells.

Although the present invention has been described with reference to preferred embodiments, workers skilled in the art will recognize that changes may be made in form and detail without departing from the spirit and scope of the invention.

What is claimed is:

1. A method of placing cells in an integrated circuit layout pattern, the method comprising:

receiving a base layer layout pattern defining an array of base cell locations and base layer elements, wherein at least portions of some rows in the array are reserved for decoupling capacitor cells, and wherein each decoupling capacitor cell has a width which is greater than that of a single base cell location and which is abstracted from the base layer layout pattern;

receiving a cell library defining a plurality of cells, including a macro cell having open rows consistent with rows in the base layer layout pattern that are reserved for the decoupling capacitor cells, wherein the width of each decoupling capacitor cell is abstracted from the macro cell; and placing cells from the cell library, including the macro cell, within a design layout pattern relative to the base layer layout pattern, wherein an area consumed by the macro cell within the design layout pattern is independent of the width of the decoupling capacitor cells.

2. The method of claim 1 wherein the width of each decoupling capacitor cell is at least ten times the width of a single base cell location.

3. The method of claim 1 wherein the width of each decoupling capacitor cell is at least one hundred times the width of a single base cell location.

4. The method of claim 1 wherein placing cells from the cell library comprises snapping the width of the macro cell to align with nearest boundaries of the base cell locations while ignoring boundaries of the decoupling capacitor cells.

5. The method of claim 1 wherein all elements of the decoupling capacitor cells are defined by the base layer layout pattern.

6. The method of claim 1 wherein at least some elements of the decoupling capacitor cells are defined in layers of the integrated circuit layout pattern that are above the base layer layout pattern.

7. The method of claim 1 wherein:
the array of base cell locations comprises a regular pattern of rows of the decoupling capacitor cells; and
the macro cell comprises a regular pattern of open rows that corresponds to the regular pattern of rows of the decoupling capacitor cells in the array of base cell locations.

8. The method of claim 1 and further comprising:
fabricating base layers of an integrated circuit according to the base layer layout pattern in which all elements of the decoupling capacitor cells are defined and accessible within in the base layer layout pattern; and
fabricating higher, programmable layers on the integrated circuit according to the design layout pattern.

9. A method of generating an integrated circuit layout pattern, the method comprising:
generating a base layer layout pattern defining an away of base cell locations and base layer elements, wherein at least portions of some rows in the array comprise decoupling capacitor cells, and wherein each decoupling capacitor cell has a width which is greater than that of a single base cell location;
abstracting the decoupling capacitor cells from the base layer layout pattern to form a customer slice layout pattern;
generating a cell library defining a plurality of cells, including a macro cell comprising open rows consistent with rows in the base layer layout pattern that comprise the decoupling capacitor cells, but with the width of each decoupling capacitor cell being abstracted from the macro cell such that the macro cell consumes an area that is independent of the width of each decoupling capacitor cell; and
providing the customer slice layout pattern and the cell library to a design customer for generating a customer design layout pattern of configurable layers in the integrated circuit layout pattern that are higher than base layers defined by the base layer layout pattern.

10. The method of claim 9 wherein the width of each decoupling capacitor cell is at least ten times the width of a single base cell location.

11. The method of claim 9 wherein the width of each decoupling capacitor cell is at least one hundred times the width of a single base cell location.

12. The method of claim 9 wherein the macro cell has properties, which allow the width of the macro cell to expand so as to align with nearest boundaries of the base cell locations while ignoring boundaries of the decoupling capacitor cells when placed in the customer design layout pattern.

13. The method of claim 9 wherein all elements of the decoupling capacitor cells are defined by the base layer layout pattern.

14. The method of claim 9 wherein at least some elements of the decoupling capacitor cells are defined by the configurable layers of the integrated circuit layout pattern.

15. The method of claim 9 and further comprising:
receiving the customer design layout pattern from a customer;
fabricating base layers of an integrated circuit on a substrate according to the base layer layout pattern; and
fabricating configurable layers on top of the base layers according to the customer design layout pattern.

16. A customer design layout pattern for fabrication of higher level configurable layers on a gate array having predefined, non-configurable base layers, the customer design layout pattern comprising:
a pattern of cell instances selected from a cell library and placed in available base cell locations defined by the non-configurable base layers; and
a macro cell selected from the cell library and placed in a block of the available base cell locations, wherein the macro cell comprises an open row which overlaps a row of the non-configurable base layers that includes one or more decoupling capacitor cells, wherein a width of each decoupling capacitor cell along the open row has been abstracted from the customer design layout pattern and wherein the macro cell consumes an area on the customer design layout pattern that is independent of the width of each decoupling capacitor cell.

* * * * *